(12) United States Patent
Cho et al.

(10) Patent No.: US 9,081,144 B2
(45) Date of Patent: Jul. 14, 2015

(54) POLARIZING PLATE FOR ORGANIC LIGHT-EMITTING DISPLAY AND DISPLAY DEVICE INCLUDING THE SAME

(71) Applicants: Hyeon Cho, Uiwang-si (KR); Do Won Kim, Uiwang-si (KR); Ran Kim, Uiwang-si (KR); Jin Sook Kim, Uiwang-si (KR); Jik Soo Shin, Uiwang-si (KR)

(72) Inventors: Hyeon Cho, Uiwang-si (KR); Do Won Kim, Uiwang-si (KR); Ran Kim, Uiwang-si (KR); Jin Sook Kim, Uiwang-si (KR); Jik Soo Shin, Uiwang-si (KR)

(73) Assignee: CHEIL INDUSTRIES, INC., Gumi-si, Kyeongsangbuk-do (KR)

( * ) Notice: Subject to any disclaimer, the term of this patent is extended or adjusted under 35 U.S.C. 154(b) by 199 days.

(21) Appl. No.: 13/708,550

(22) Filed: Dec. 7, 2012

(65) Prior Publication Data

US 2013/0163081 A1   Jun. 27, 2013

(30) Foreign Application Priority Data

Dec. 12, 2011   (KR) .................. 10-2011-0133084

(51) Int. Cl.
*G02B 5/30* (2006.01)
*H01L 51/52* (2006.01)

(52) U.S. Cl.
CPC ........... *G02B 5/3025* (2013.01); *H01L 51/5281* (2013.01)

(58) Field of Classification Search
CPC .................. G02B 5/3025; H01L 51/5281
USPC ........................ 359/485.03, 487.02
See application file for complete search history.

(56) References Cited

U.S. PATENT DOCUMENTS

| | | | | |
|---|---|---|---|---|
| 6,961,178 B2 * | 11/2005 | Sugino et al. | ............ | 359/485.03 |
| 7,064,896 B2 * | 6/2006 | Kuwamura | .............. | 359/485.03 |
| 7,408,603 B2 * | 8/2008 | Nakata et al. | ................. | 349/119 |
| 7,463,320 B2 * | 12/2008 | Kobayashi et al. | ........... | 349/117 |
| 8,531,765 B2 * | 9/2013 | Sakai et al. | .............. | 359/489.07 |
| 2007/0042189 A1 * | 2/2007 | Shirai et al. | ................. | 428/411.1 |
| 2009/0162577 A1 * | 6/2009 | Inoue et al. | .................. | 428/1.54 |
| 2010/0245727 A1 * | 9/2010 | Shigetomi et al. | .............. | 349/96 |
| 2011/0051062 A1 * | 3/2011 | Sakai | ............................ | 349/120 |
| 2011/0140597 A1 | 6/2011 | Lee et al. | | |
| 2013/0099219 A1 * | 4/2013 | Kim et al. | ....................... | 257/40 |

FOREIGN PATENT DOCUMENTS

| | | |
|---|---|---|
| CN | 1782810 A | 6/2006 |
| CN | 1825188 A | 8/2006 |
| CN | 101281267 A | 10/2008 |
| CN | 101418198 A | 4/2009 |
| JP | 2009-031474 A | 2/2009 |
| KR | 10-2005-0073221 A | 7/2005 |
| KR | 10-2006-0064547 A | 6/2006 |
| KR | 10-2010-0008203 A | 1/2010 |

(Continued)

OTHER PUBLICATIONS

Korean Office action dated Mar. 24, 2014 for KR 10-2011-0133084, Hyeon Cho, et al.
Taiwanese Office action dated Jun. 9, 2014 for TW 101146715, Hyeon Cho, et al.

(Continued)

*Primary Examiner* — Frank Font
(74) *Attorney, Agent, or Firm* — Lee & Morse, P.C.

(57) ABSTRACT

A polarizing plate for use with an organic light emitting display includes an adhesive layer, a retardation film, a polarizer, and a protective film sequentially stacked in this order, the polarizing plate further including a positive C plate.

16 Claims, 10 Drawing Sheets

(56) References Cited

FOREIGN PATENT DOCUMENTS

| | | |
|---|---|---|
| KR | 10-2011-0068638 A | 6/2011 |
| TW | 200527078 A | 8/2005 |
| WO | WO 2011/016645 A2 | 2/2011 |

OTHER PUBLICATIONS

Korean Office Action dated Nov. 4, 2014.
Chinese Office Action dated Sep. 2, 2014.

* cited by examiner

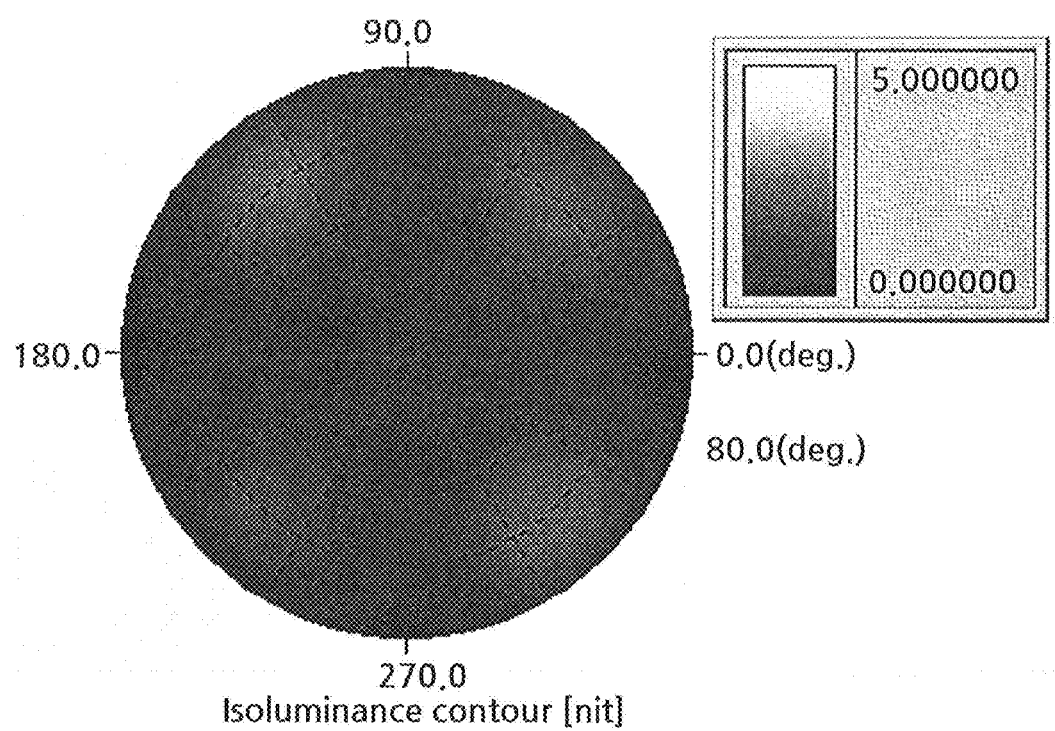

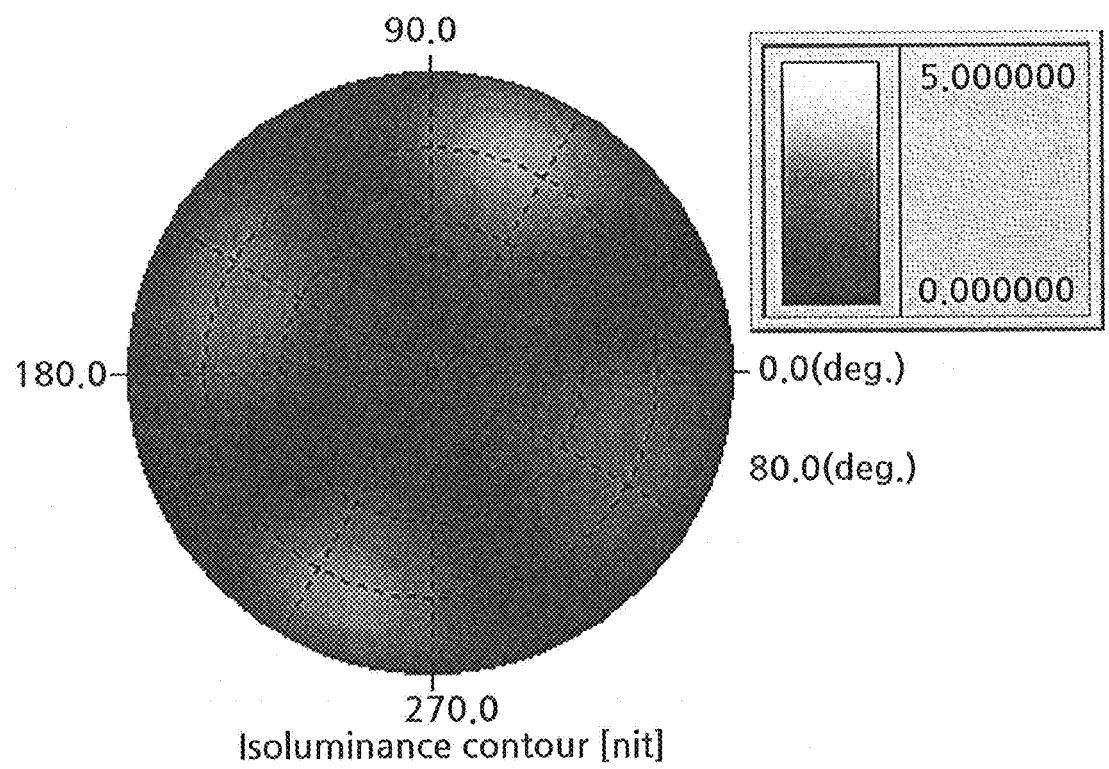

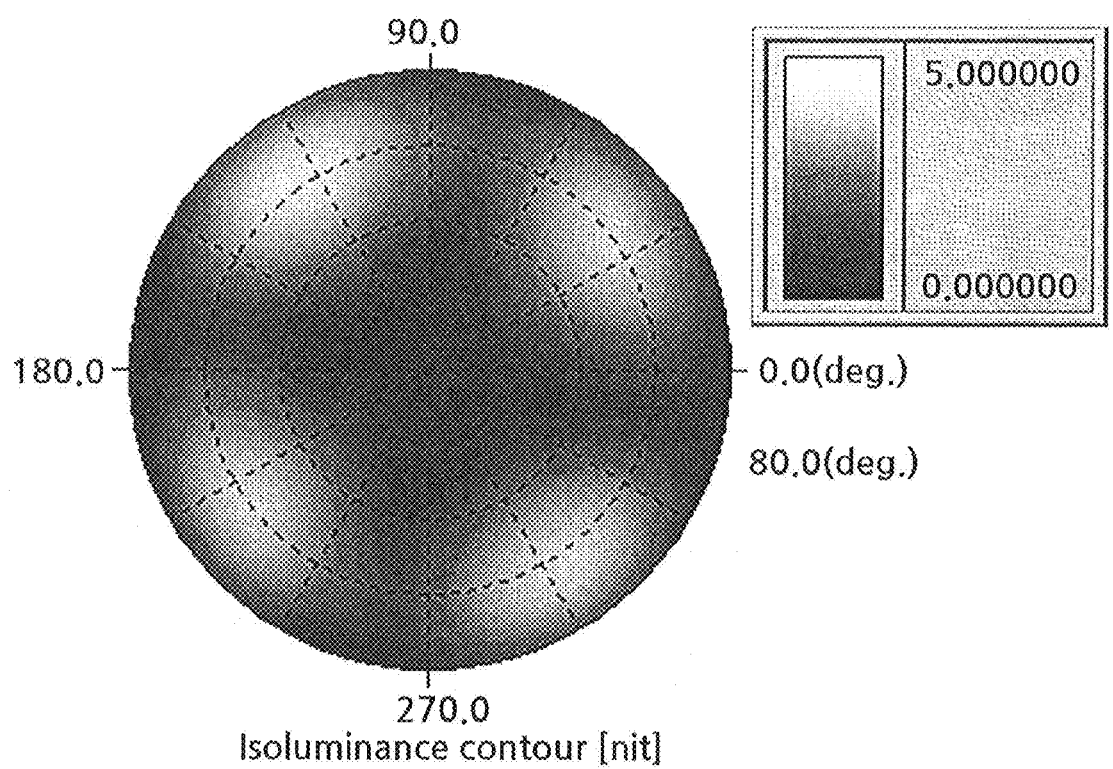

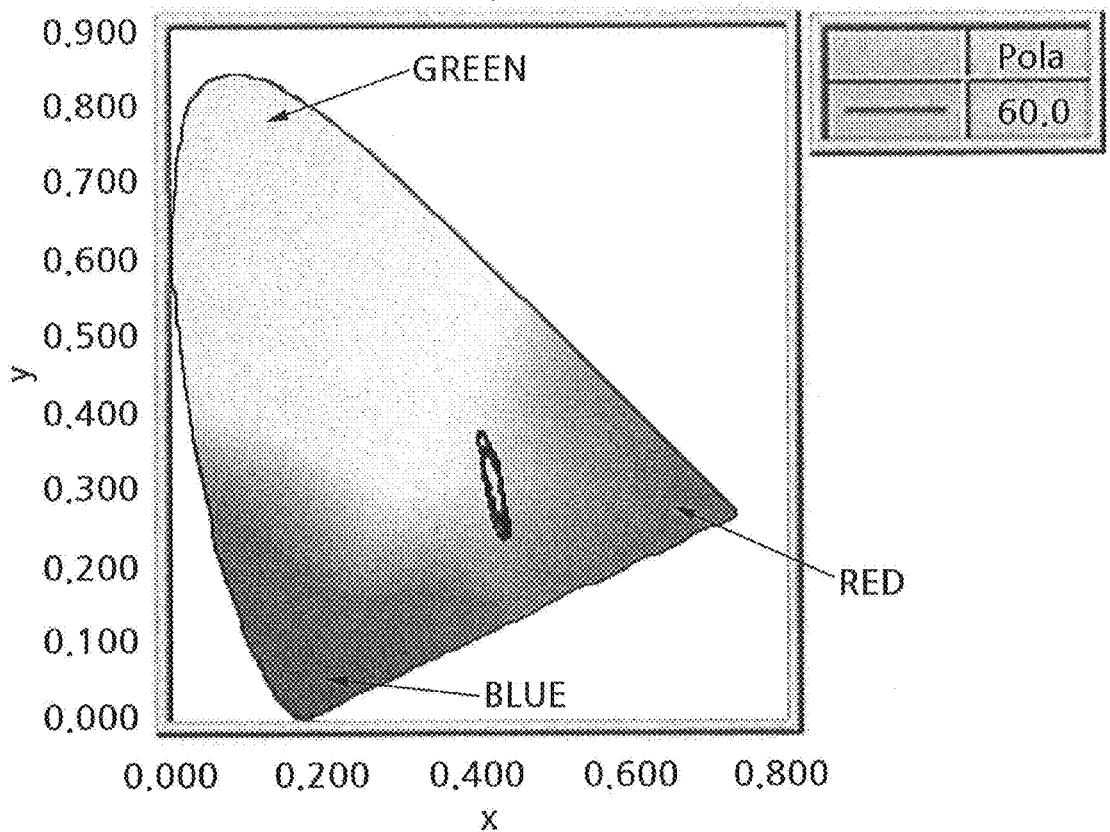

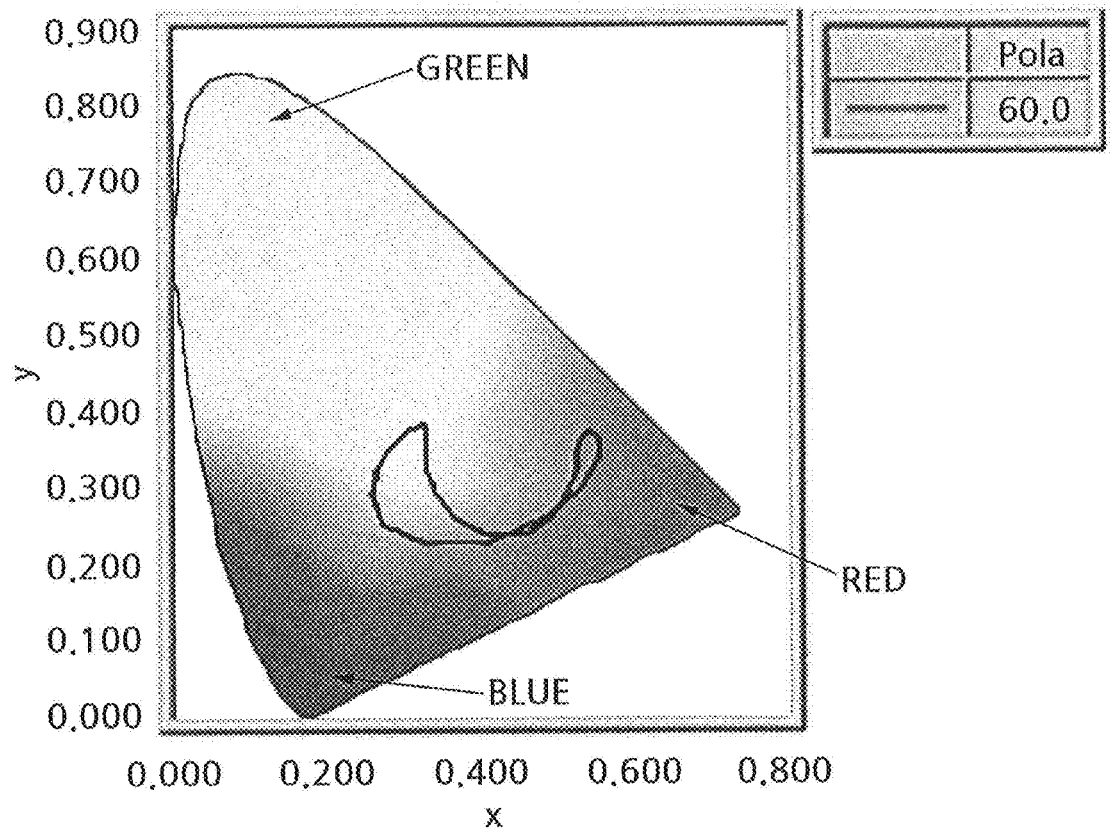

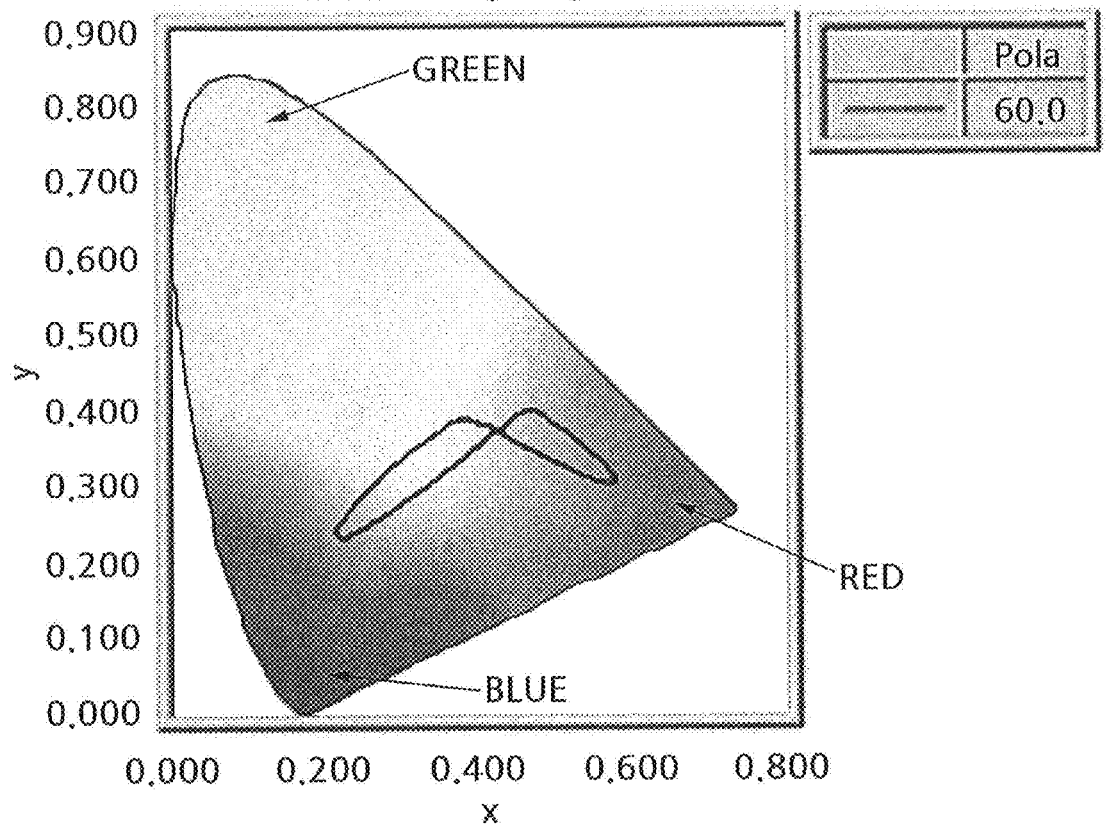

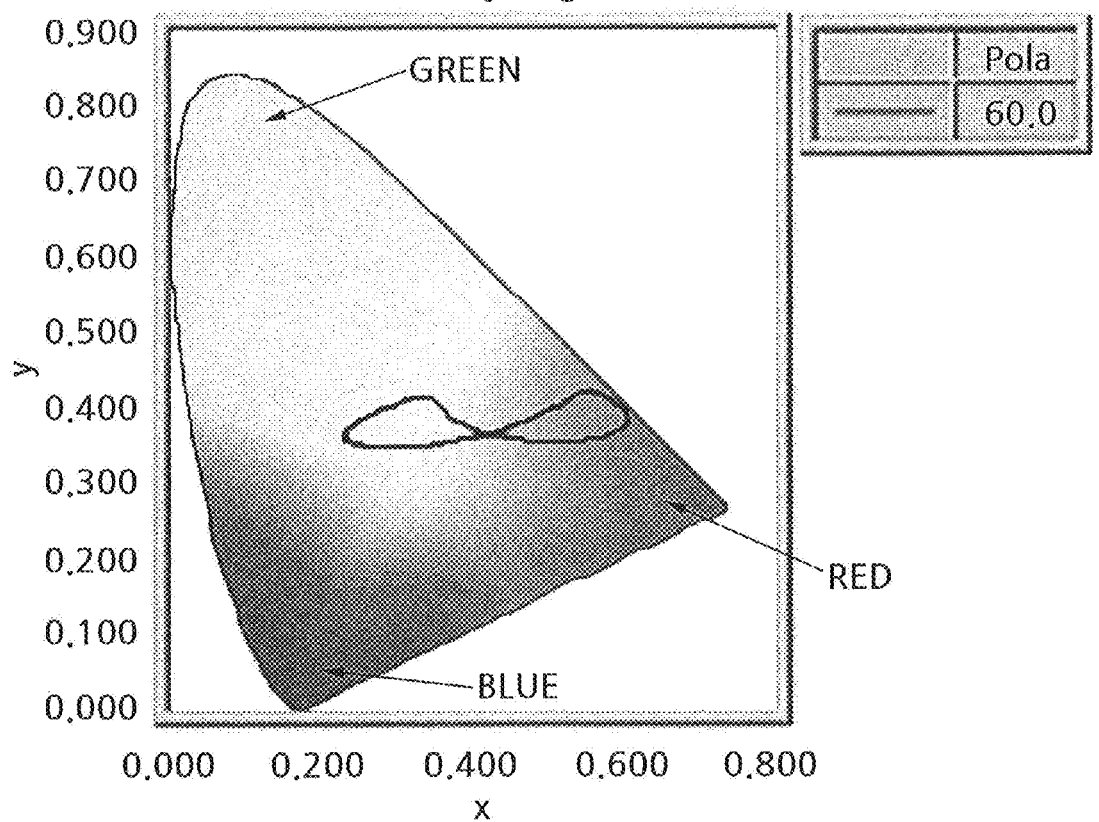

US 9,081,144 B2

POLARIZING PLATE FOR ORGANIC LIGHT-EMITTING DISPLAY AND DISPLAY DEVICE INCLUDING THE SAME

CROSS-REFERENCE TO RELATED APPLICATION

The present application claims priority under 35 U.S.C. §119 to and benefit of Korean Patent Application No. 10-2011-0133084 filed on Dec. 12, 2011, in the Korean Intellectual Property Office, and entitled: "POLARIZING PLATE FOR ORGANIC LIGHT-EMITTING DIODE AND DISPLAY DEVICE INCLUDING THE SAME," which is incorporated by reference herein in its entirety.

BACKGROUND

1. Field

Embodiments relate to a polarizing plate for an organic light-emitting display and an optical display device including the same.

2. Description of the Related Art

An organic light-emitting diode includes an anode, a cathode, and an organic light-emitting layer interposed in the form of a functional thin layer between the anode and the cathode. When holes and electrons are injected from the anode and the cathode into the organic light-emitting layer, i.e. an organic electroluminescent (EL) layer composed of R, G and B, the holes and electrons are combined to create excitons, which recombine to emit light.

In the organic light-emitting device, substantially 100% of internal light is emitted outside, whereas about 40% of external light is reflected, thereby causing deterioration of image quality. In particular, since a contrast ratio can be deteriorated due to low visibility of dark colors, a polarizing plate may be attached to an external surface of the organic light-emitting device to reduce reflection of external light.

However, the inner structure of the organic light-emitting display causes resonance, whereby color variation can occur due to difference between lengths of light paths depending on viewing angle, thereby causing deterioration in lateral viewing angle. In particular, the contrast ratio and colors can vary depending on lateral viewing angle due to characteristics of a retardation film provided in the polarizing plate.

SUMMARY

One or more embodiments may provide a polarizing plate for an organic light-emitting display, which includes an adhesive layer, a retardation film, a polarizer, and a protective film sequentially stacked in this order, and may further include a positive C plate.

In one embodiment, the positive C plate may be interposed between the polarizer and the retardation film.

In one embodiment, the positive C plate may be interposed between the retardation film and the adhesive layer.

In one embodiment, the positive C plate may have an in-thickness retardation (Rth) of about −130 nm to about −50 nm at a wavelength of 550 nm.

In one embodiment, the positive C plate may have an in-plane retardation (Re) of about 0 nm to about 5 nm at a wavelength of 550 nm.

In one embodiment, the retardation film may have an in-thickness retardation (Rth) of about 50 nm to about 150 nm at a wavelength of 550 nm.

In one embodiment, the retardation film may have an in-plane retardation (Re) of about 100 nm to about 150 nm at a wavelength of 550 nm.

In one embodiment, the sum of in-thickness retardations of the retardation film and the positive C plate may range from about −30 nm to about 30 nm at a wavelength of 550 nm.

In one embodiment, the polarizing plate may further include at least one functional film stacked on the protective film. Here, the at least one functional film may be selected from the group consisting of low reflectivity films, anti-glare films, low reflectivity and anti-glare hybrid films, and hard coating films.

In one embodiment, the adhesive layer may include adhesive resins and dyes.

One or more embodiments may provide an optical display device including the polarizing plate for an organic light-emitting display.

BRIEF DESCRIPTION OF THE DRAWINGS

Features will become apparent to those of ordinary skill in the art by describing in detail exemplary embodiments with reference to the attached drawings in which:

FIGS. 4 to 7 respectively illustrate diagrams of reflective brightness distribution of polarizing plates of Examples 1 to 3 and Comparative Example 1, as measured using a CM-3600d spectrometer (Konica Minolta Optics Co., Ltd.);

FIGS. 8 to 11 respectively illustrate CIE chromaticity diagrams for reflective colors of the polarizing plates of Examples 1 to 3 and Comparative Example 1, as measured using a CM-3600d spectrometer (Konica Minolta Optics Co., Ltd.)

DETAILED DESCRIPTION

Figure 1:
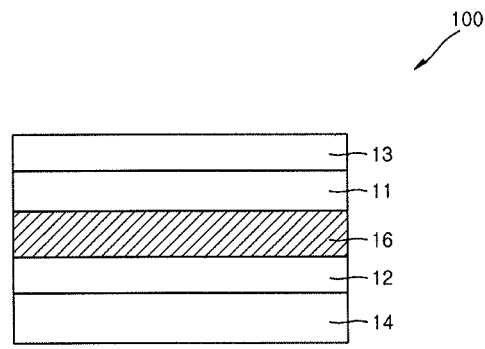
FIGS. 1 to 3 illustrate sectional views of polarizing plates for an organic light-emitting diode according to exemplary embodiments.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

In accordance with one or more embodiments, a polarizing plate for an organic light-emitting display may be formed by sequentially stacking an adhesive layer, a retardation film, a polarizer and a protective film, and may further include a positive C plate.

The positive C plate may be a film made of a material having a higher index of refraction in a z-axis direction than the indexes of refraction in x- and y-axis directions, and having a negative in-thickness retardation (Rth), as calculated according to Equation 1 below. Generally, retardation films disadvantageously have in-thickness retardation (Rth) that increases with increasing in-plane retardation (Re), thereby causing deterioration in viewing angle. However, when the polarizing plate includes the positive C plate in accordance with embodiments, the in-thickness retardation (Rth) of the retardation film is decreased, whereby differences between characteristics of front and lateral viewing angles may be reduced, thereby improving lateral viewing angle.

The positive C plate may have an in-thickness retardation (Rth) within a certain range. For example, the positive C plate may have an in-thickness retardation (Rth) of, e.g., about −130 nm to about −50 nm at a wavelength of 550 nm, as calculated according to Equation 1:

$$Rth=((nx+ny)/2-nz) \times d \qquad \text{[Equation 1]}$$

where nx, ny, and nz are indexes of refraction in x-, y-, and z-axis directions of the positive C plate, respectively, and d is the thickness, e.g., a distance along the z-axis direction, of the positive C plate.

Within this range, the lateral viewing angle may be improved without changing the inner structure of an organic light-emitting cell. The in-thickness retardation (Rth) may range from about −110 nm to about −50 nm at a wavelength of 550 nm.

Further, the positive C plate may have an in-plane retardation (Re) of about 0 nm to about 5 nm at a wavelength of 550 nm, as calculated according to Equation 2:

$$Re=(nx-ny) \times d, \qquad \text{[Equation 2]}$$

where nx, and ny are indexes of refraction in x-, and y-axis directions of positive C plate, respectively, and d is the thickness of the positive C plate. In particular, the in-plane retardation (Re) may range from about 0 nm to about 2 nm, e.g., from about 0 nm to about 1 nm, e.g., from about 0.2 nm to about 0.7 nm at a wavelength of 550 nm.

Although the positive C plate is not limited to a particular thickness, it may have a thickness of about 0.5 μm to about 20 μm for stacking in a polarizing plate. In addition to the positive C plate, the polarizing plate may include a sequential stack of an adhesive layer, a retardation film, a polarizer, and a protective film in this order. The positive C plate may be interposed between the polarizer and the retardation film or between the retardation film and the adhesive layer in the polarizing plate.

The polarizer may have a thickness of about 5 μm to about 30 μm, without being limited thereto. The polarizer may orient light having passed through the retardation film. The polarizer may divide light components into two polarization components, which are orthogonal to each other, and may allow light having one polarization component to pass therethrough while absorbing or dispersing light having the other polarization component.

Any polarizer generally used in manufacture of the polarizing plate may be used with embodiment herein without limitation. The polarizer may be formed by dyeing a polyvinyl alcohol film with iodine or dichroic dyes and stretching the dyed film in a certain direction. Specifically, the polarizer may be manufactured by swelling, dyeing, stretching, and crosslinking. The process for manufacturing the polarizer is well-known in the art.

The retardation film may adjust phase retardation or improve viewing angle by adjusting optical properties of light. For example, the retardation film may be a λ/4 retardation film that can change circular polarized light into linear polarized light or vice versa by inducing a phase difference of λ/4 between two polarized components which are parallel to an optical axis of the retardation film and orthogonal to each other. The retardation film can change circular polarized light emitted from an organic light-emitting display into linear polarized light or vice versa.

The retardation film may be classified into a uniaxial retardation film having a single optical axis and a biaxial retardation film having two optical axes. Further, the retardation film may be divided into positive and negative retardation films depending on indexes of refraction in an optical axis direction and other directions. Specifically, the retardation film may have a positive value when the retardation film has a higher index of refraction in the optical axis direction, i.e., the z-axis direction, than the index of refraction in other directions, and the retardation film may have a negative value when the film has a smaller index of refraction in the optical axis direction than the index of refraction in the other directions.

The retardation film may be a positive biaxial film. The retardation film may have an in-thickness retardation (Rth) ranging from about 50 nm to about 150 nm, e.g., about 100 nm, at a wavelength of 550 nm, as calculated according to Equation 1 described above.

The retardation film may have an in-plane retardation (Re) ranging from about 100 nm, e.g., about 120 nm, to about 150 nm at a wavelength of 550 nm, as calculated according to Equation 2 described above. Within this range, the retardation film can exhibit circular polarization characteristics when an angle of 45° is defined between an absorbing axis of the polarizing plate and a phase retardation axis of the retardation film.

With regard to phase retardation value, a degree of biaxiality Nz may be obtained according to Equation 3:

$$Nz=(nx-nz)/(nx-ny), \qquad \text{[Equation 3]}$$

where nx, ny, and nz are indexes of refraction in x-, y-, and z-axis (thickness) directions of the retardation film, respectively. The retardation film may have a degree of biaxiality Nz from about 0 to about 2, e.g., from about 0.5 to about 1.5, at a wavelength of 550 nm as calculated according to Equation 3.

The sum of the in-thickness retardations (Rth) of the retardation film and the positive C plate may range from about −30 nm to about 30 nm at a wavelength of 550 nm. Within this range, viewing angle can be improved by compensating for the in-thickness phase retardation of the retardation film.

Any retardation film commonly used in manufacture of a polarizing plate for organic light-emitting displays and having phase retardation properties may be used with embodiments herein without limitation. The retardation film may be formed of a material selected from, e.g., acrylic films polycarbonate films, polystyrene films, polyimide films, cellulose films, olefin films, cyclo-olefin polymer films, or combinations thereof.

The retardation film may have a thickness of about 10 μm to about 150 μm, e.g., about 30 μm to about 120 μm. Within this range, the retardation film applied to the polarizing plate can provide optical compensation and anti-reflection effects through circular polarization Any protective film commonly used in a polarizing plate may be used with embodiments herein without limitation. For example, the protective film may be selected from celluloses, polyesters, cyclic polyolefins, polycarbonates, polyether sulfones, polysulfones, polyamides, polyimides, polyolefins, polyarylates, polyvinyl alcohols, polyvinyl chlorides, polyvinylidene chlorides, and mixtures thereof, e.g., a tri-acetyl cellulose film.

The protective film may have a thickness of about 10 μm to about 100 μm, e.g., about 40 μm to about 80 μm. Within this range, the protective film applied to the polarizing plate can allow optical compensation and can protect the polarizer from external conditions. In addition, the protective film can provide additional effects such as higher hardness, low reflectivity, and anti-glare properties through surface treatment.

The protective film and the polarizer, the polarizer and the retardation film, the retardation film and the positive C plate, and the polarizer and the positive C plate may be bonded to each other by a typical bonding layer. Any bonding agent commonly used in manufacture of the polarizing plate may be used. For example, the bonding layer may be formed using a polyvinyl alcohol-based bonding agent.

The adhesive layer may serve to attach the polarizing plate to a substrate of the organic light-emitting display. The adhesive layer may include any adhesive resin commonly used in manufacture of the polarizing plate for an organic light-emitting display.

For example, the adhesive resin may be selected from (meta)acrylic resins, silicone resins, amide resins, ether resin, imide resins, fluorine resins, urethane resins, polyisobutylene resins, styrene butadiene rubber resins, polyvinyl ether resins, epoxy resins, melamine resins, polyester resins, phenol resins, and mixtures thereof.

The adhesive layer may further include dyes. Dyes can provide an effect of lowering reflectivity with respect to light having particular wavelengths as well as an anti-reflection effect through the retardation film. For example, any dyes having an absorption wavelength of visible light from about 380 nm to about 430 nm may be used without limitation. For example, the dyes may be selected from anthraquinone, methine, azomethine, oxadine, azo, styryl, coumarin, porphyrin, dibenzofuranone, diketopyrrolopyrrole, rhodamine, xanthene, pyrromethene dyes, and mixtures thereof.

When the adhesive layer includes both an adhesive resin and dyes, the adhesive resin and the dyes may be mixed in a weight ratio of about 100:1 to 2000:1. Within this range, reflectivity of light having a particular wavelength can be reduced without affecting luminescence of a display device including the organic light-emitting diode.

The adhesive layer may have a thickness of about 5 μm to 50 e.g., about 15 μm to about 30 μm. Within this range, the polarizing plate can be attached to a glass surface of the display device including the organic light-emitting diode.

FIG. 1 illustrates a sectional view of a polarizing plate 100 according to an embodiment. Referring to FIG. 1, the polarizing plate 100 according to this embodiment may be formed by sequentially stacking a protective film 13 and a retardation film 12 on opposite sides of a polarizer 11 (a bonding layer is not shown), and an adhesive layer 14 may be stacked on one side of the retardation film 12 (a bonding layer is not shown). A positive C plate 16 may be interposed between the polarizer 11 and the retardation film 12 (a bonding layer is not shown).

Figure 2:
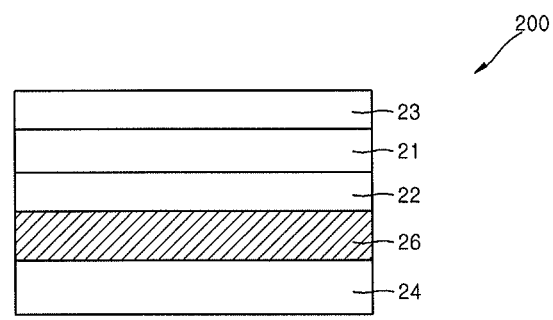

FIG. 2 illustrates a sectional view of a polarizing plate 200 according to another embodiment. Referring to FIG. 2, the polarizing plate 200 according to this embodiment may be formed by stacking a protective film 23 on one side of a polarizer 21 (a bonding layer is not shown), and a retardation film 22 on the other side of the polarizer 21 (a bonding layer is not shown). An adhesive layer 24 may be stacked on one side of the retardation film 22, and a positive C plate 26 may be interposed between the retardation film 22 and the adhesive layer 24 (a bonding layer is not shown).

In some embodiments, the polarizing plate may further include at least one functional film stacked on the protective film. Here, the at least one functional film may be selected from low reflectivity films, anti-glare films, low reflectivity and anti-glare hybrid films, and hard coating films. Preferably, a low reflectivity film is stacked on the protective film in order to prevent glare.

Figure 3:
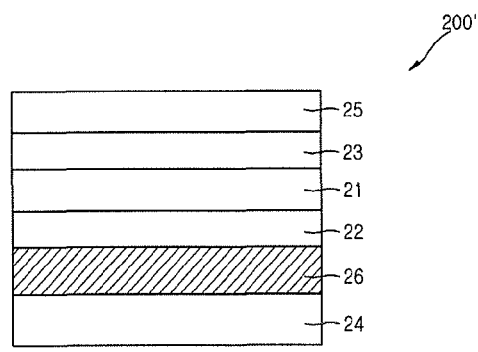

FIG. 3 illustrates a sectional view of a polarizing plate 200' according to a further embodiment. Referring to FIG. 3, the polarizing plate 200' according to this embodiment may be formed by stacking the protective film 23 on one side of the polarizer 21 and the retardation film 22 on the other side of the polarizer 21. The adhesive layer 24 may be stacked on one side of the retardation film 22 and a functional film 25 may be stacked on one side of the protective film 23. The positive C plate 26 may be interposed between the retardation film 22 and the adhesive layer 24.

Figure 12:
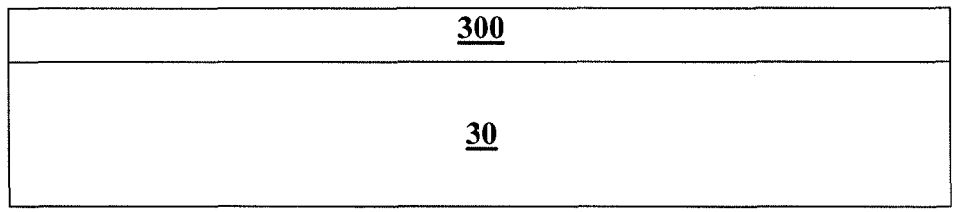
FIG. 12 illustrates a schematic sectional view of a display according to an embodiment.
Figure 4:
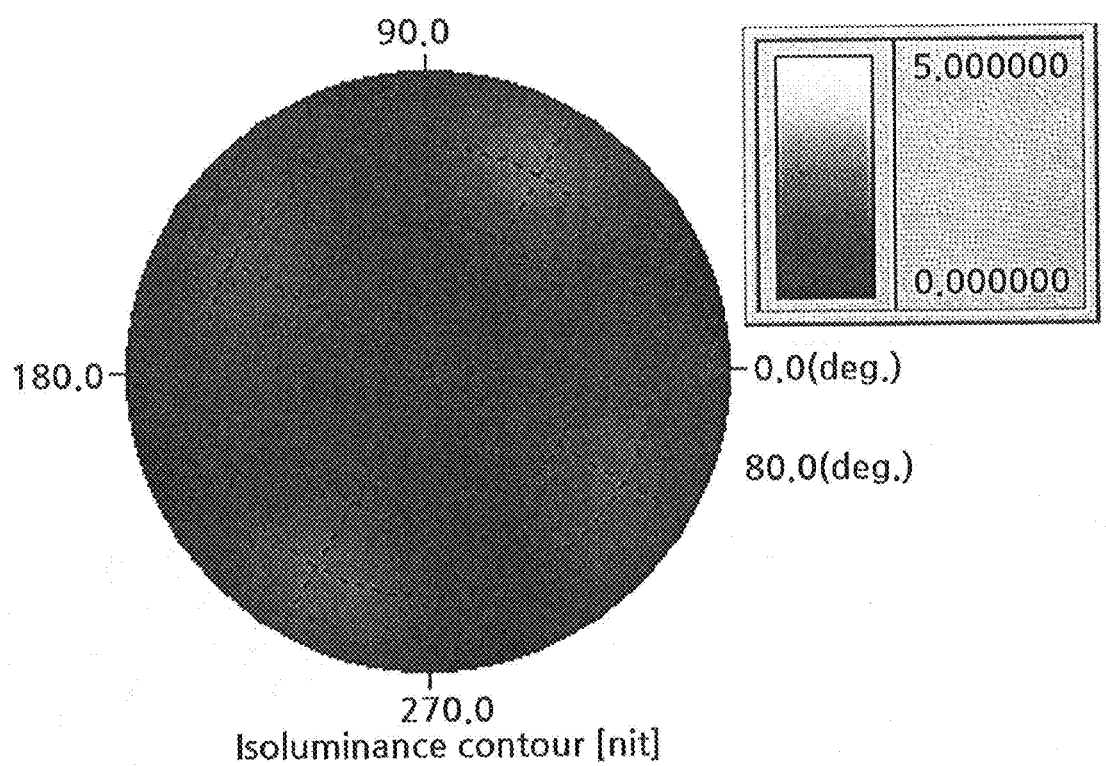

According to embodiments, as illustrated in FIG. 12, an organic light-emitting display may include an organic light emitting display panel 30 and a polarizing plate 300. The polarizing plate 300 may be any of the polarizing plates described above, with the adhesive layer thereof facing a light emitting surface of the display panel 30. The polarizing plate 300 may be provided on the organic light-emitting display panel 30 through a typical method in the art.

Next, the constitution and functions of embodiments will be explained in more detail with reference to the following examples. These examples are provided for illustrative purposes only and should not to be construed in any way as limiting.

Descriptions of details apparent to those skilled in the art will be omitted herein.

Detailed specifications of polarizing plates of Examples and Comparative Examples were as follows:

(A) Polarizers were made of a polyvinyl alcohol film (thickness: 60 μm, Kuraray Co., Ltd., Japan);

(B) Protective films were made of a tri-acetyl cellulose (TAC) film having low reflection coating (thickness: 80 μm, Toppan Printing Co., Ltd);

(C) Retardation films were made of a cyclic-olefin polymer λ/4 film having Re of 137.5 nm and Rth of 82.5 nm at a wavelength of 550 nm and Nz of 1.1 at a wavelength of 550 nm (thickness: 50 Zeon Corporation);

(D) Polyvinyl alcohol adhesives (Soken Chemical & Engineering Co., Ltd.) were used as a bonding agent;

(E) The following C plates were used as positive C plates;

(E-1) Positive C plate having Re of 0.3 nm and Rth of −80 nm at a wavelength of 550 nm (thickness: 13 μm, JX Nippon Oil & Energy Corporation);

(E-2) Positive C plate having Re of 0.7 nm and Rth of −50 nm at a wavelength of 550 nm (thickness: 13 μm, JX Nippon Oil & Energy Corporation);

(E-3) Positive C plate having Re of 0.2 nm and Rth of −110 nm at a wavelength of 550 nm (thickness: 13 μm, JX Nippon Oil & Energy Corporation);

(F) An acrylic adhesive resin (Soken Chemical & Engineering Co., Ltd.) was used as an adhesive.

Example 1

A polarizer was formed by stretching a polyvinyl alcohol film to 5 times an initial length in an aqueous iodine solution at 40° C., followed by drying at 80° C. for 10 minutes. To one side and the other side of the polarizer, a low reflection coating TAC film as a protective film and a λ/4 retardation film were respectively attached using a polyvinyl alcohol-based bonding agent such that an angle of 45° was defined between a retardation axis and an absorption axis of a polarizing plate. Then, a positive C plate (E-1) was attached to the λ/4 retardation film via the bonding agent. An adhesive was applied to one side of the positive C plate and dried at 90° C. for 4 minutes such that the solvent could be evaporated, thereby preparing a polarizing plate.

Example 2

A polarizing plate was prepared in the same manner as in Example 1 except that the positive C plate E-2 was used instead of the positive C plate E-1.

Example 3

A polarizing plate was prepared in the same manner as in Example 1 except that the positive C plate E-3 was used instead of the positive C plate E-1.

Comparative Example 1

A polarizing plate was prepared in the same manner as in Example 1 except that the positive C plate E-1 was not used.

Experimental Example

Measurement of Physical Properties of Polarizing Plate

The polarizing plates prepared in the examples and the comparative example were evaluated as to physical properties as listed in Table 1. The physical properties of the polarizing plate were measured using a CM-3600d spectrometer (Konica-Minolta Optics Inc.), which can measure reflectivity, transmittance, and color coordination under various light sources. The polarizing plate was attached to a glass panel placed on a light-emitting side of an OLED. With the polarizing plate fixed to an aperture having a diameter of 2.5 mm, measurement was performed. There was no deviation according to measuring direction, and reflective brightness and reflective colors could be determined based on measured values and graphs. Results are shown in Table 1 and FIGS. 4 to 11.

Deviation of reflective colors at a polar angle of 60 degrees was calculated according to Equation 4 using deviation of reflectivity in X and Y directions. Low deviation of reflective colors at a polar angle of 60 degrees means insignificant color variation when a display device including the organic light-emitting diode is viewed from all directions.

Deviation of reflective colors at a polar angle of 60 degrees=$(x^2-y^2)^{1/2}$   [Equation 4]

where x and y are deviations of x-coordinate values and y-coordinate values in the CIE chromaticity diagram at a polar angle of 60 degrees, respectively)

TABLE 1

|  | Example 1 | Example 2 | Example 3 | Comparative Example 1 |
|---|---|---|---|---|
| Positive C plate | included | included | included | not included |
| Re of positive C plate (nm) | 0.3 | 0.7 | 0.2 | — |
| Rth of positive C plate (nm) | −80 | −50 | −110 | — |
| Brightness in front side (Cd/m²) | 0.48 | 0.48 | 0.48 | 0.47 |
| brightness at a polar angle of 60 degrees (Cd/m²) | 1.20 | 1.30 | 1.89 | 3.07 |
| Deviation of reflective color at a polar angle of 60 degrees | 0.150 | 0.337 | 0.344 | 0.379 |

As can be seen from Table 1 and FIGS. 4 to 11, the polarizing plate including the positive C plate according embodiments enhanced lateral viewing angle by significantly reducing brightness at a polar angle of 60 degrees while maintaining brightness in the front side. Further, the polarizing plate including the positive C plate according to embodiments enhanced lateral viewing angle due to low deviation of reflective color. However, the polarizing plate not including the positive C plate did not provide any enhancement of lateral viewing angle since it provided relatively high brightness at a polar angle of 60 degrees and relatively high deviation of reflective color.

By way of summation and review, embodiments provide a polarizing plate for an organic light-emitting diode that can improve lateral viewing angle without changing an inner structure of a light-emitting cell of the organic light-emitting display, and an optical display device including the same. Thus, a resonant structure of the organic light-emitting display may be compensated.

In contrast, other solutions include a non-resonance structure obtained by adding a blue light emitting layer to a light emitting cell of the organic light-emitting display. However, this solution requires change of cell structures of existing organic light-emitting displays, thereby complicating manufacturing.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A polarizing plate for an organic light-emitting display, the polarizing plate comprising:
   a stack sequentially including an adhesive layer, a retardation film, a polarizer, and a protective film sequentially; and
   a positive C plate in contact with the retardation film, wherein a sum of in-thickness retardations of the retardation film and the positive C plate lies within a range to compensate for the in-thickness retardation of the retardation film.

2. The polarizing plate as claimed in claim 1, wherein the positive C plate is interposed between the polarizer and the retardation film.

3. The polarizing plate as claimed in claim 1, wherein the positive C plate is interposed between the retardation film and the adhesive layer.

4. The polarizing plate as claimed in claim 1, wherein the positive C plate has an in-thickness retardation (Rth) of about −130 nm to about −50 nm at a wavelength of 550 nm, Rth being calculated according to the following Equation $Rth=((nx+ny)/2-nz)\times d$, where nx, ny, and nz are indexes of refraction in x-, y- and z-axis directions of the positive C plate, respectively, and d is a thickness of the positive C plate.

5. The polarizing plate according as claimed in claim 1, wherein the positive C plate has an in-plane retardation (Re)

of about 0 nm to about 5 nm at a wavelength of 550 nm, Re being calculated according to the following $$Re = (nx - ny) \times d,$$

where nx, and ny are indexes of refraction in x- and y-axis directions of the positive C plate, respectively, and d is a thickness of the positive C plate.

6. The polarizing plate as claimed in claim 1, wherein the positive C plate has a thickness of about 0.5 μm to about 20 μm.

7. The polarizing plate as claimed in claim 1, wherein the retardation film has an in-thickness retardation (Rth) of about 50 nm to about 150 nm at a wavelength of 550 nm.

8. The polarizing plate as claimed in claim 1, wherein the retardation film has an in-plane retardation (Re) of about 100 nm to about 150 nm at a wavelength of 550 nm.

9. The polarizing plate as claimed in claim 1, wherein the retardation film has a degree of biaxiality Nz that ranges from about 0 to about 2 at a wavelength of 550 nm, Nz being calculated according to the following $$Nz = (nx - nz)/(nx - ny),$$

where nx, ny, and nz are indexes of refraction in x-, y-, and z-axis directions of the retardation film, respectively.

10. The polarizing plate as claimed in claim 1, wherein a sum of the in-thickness retardations of the retardation film and the positive C plate ranges from about −30 nm to about 30 nm at a wavelength of 550 nm.

11. The polarizing plate according as claimed in claim 1, further comprising at least one functional film, the at least one functional film being at least one of low reflectivity films, anti-glare films, low reflectivity and anti-glare hybrid films, or hard coating films.

12. The polarizing plate according as claimed in claim 11, wherein the at least one functional film is stacked on the protective film.

13. The polarizing plate as claimed in claim 1, wherein the adhesive layer comprises an adhesive resin and a dye.

14. The polarizing plate as claimed in claim 13, wherein the dye has an absorption wavelength of about 380 nm to about 430 nm.

15. An optical display device, comprising:
a display panel; and
a polarizing plate, the polarizing plate including:
a stack sequentially including an adhesive layer, a retardation film, a polarizer, and a protective film sequentially, the adhesive layer facing a light emitting surface of the display panel; and
a positive C plate in contact with the retardation film, wherein a sum of in-thickness retardations of the retardation film and the positive C plate lies within a range to compensate for the in-thickness retardation of the retardation film.

16. An optical display device as claimed in claim 15, wherein the display panel is an organic light-emitting display panel.

* * * * *